(12) United States Patent
Imamura

(10) Patent No.: US 9,935,602 B2
(45) Date of Patent: *Apr. 3, 2018

(54) LAMINATED LC FILTER

(71) Applicant: Murata Manufacturing Co., Ltd., Nagaokakyo-shi, Kyoto-fu (JP)

(72) Inventor: Mitsutoshi Imamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/267,549

(22) Filed: Sep. 16, 2016

(65) Prior Publication Data

US 2017/0093358 A1 Mar. 30, 2017

(30) Foreign Application Priority Data

Sep. 26, 2015 (JP) .................. 2015-189058

(51) Int. Cl.
| | |
|---|---|
| H03H 7/09 | (2006.01) |
| H01F 27/28 | (2006.01) |
| H01F 27/29 | (2006.01) |
| H03H 1/00 | (2006.01) |
| H03H 7/01 | (2006.01) |
| H01F 17/00 | (2006.01) |
| H01G 4/12 | (2006.01) |
| H01G 4/228 | (2006.01) |
| H01G 4/30 | (2006.01) |

(Continued)

(52) U.S. Cl.
CPC ........... *H03H 7/09* (2013.01); *H01F 17/0013* (2013.01); *H01F 27/2804* (2013.01); *H01F 27/29* (2013.01); *H01G 4/12* (2013.01); *H01G 4/228* (2013.01); *H03H 1/00* (2013.01); *H03H 7/0115* (2013.01); *H01F 2017/0026* (2013.01); *H01F 2027/2809* (2013.01); *H01G 4/012* (2013.01); *H01G 4/30* (2013.01); *H01G 4/40* (2013.01); *H03H 2001/0085* (2013.01)

(58) Field of Classification Search
CPC ............. H03H 2001/0085; H03H 7/09; H03H 7/0115; H01F 2017/0026
USPC .................................................. 333/175, 185
See application file for complete search history.

(56) References Cited

U.S. PATENT DOCUMENTS

| | | | | |
|---|---|---|---|---|
| 2007/0241839 | A1* | 10/2007 | Taniguchi | ................ H03H 7/09 333/185 |
| 2012/0319801 | A1* | 12/2012 | Taniguchi | ............ H03H 7/0115 333/185 |
| 2013/0229241 | A1 | 9/2013 | Imamura | |

FOREIGN PATENT DOCUMENTS

WO 2012/077498 A1 6/2012

OTHER PUBLICATIONS

Imamura, "Laminated LC Filter", U.S. Appl. No. 15/413,563, filed Jan. 24, 2017.

* cited by examiner

*Primary Examiner* — Rakesh Patel
(74) *Attorney, Agent, or Firm* — Keating & Bennett, LLP

(57) ABSTRACT

In a laminated LC filter, at least four LC parallel resonators are provided inside a multilayer body. At least a pair of loops of inductors in odd numbered-stage LC parallel resonators among the at least four LC parallel resonators are disposed at an angle at which magnetic coupling is obtained therebetween, and winding directions thereof are the same, so as to obtain magnetic coupling between the inductors. In addition, magnetic coupling may also be obtained between a pair of loops of inductors in even numbered-staged LC parallel resonators among the at least four LC parallel resonators.

15 Claims, 9 Drawing Sheets

(51) Int. Cl.
*H01G 4/40* (2006.01)
*H01G 4/012* (2006.01)

DIELECTRIC LAYERS 1a - 1g ARE
NOT ILLUSTRATED

DIELECTRIC LAYERS 1a - 1g ARE
NOT ILLUSTRATED

LAMINATED LC FILTER

CROSS REFERENCE TO RELATED APPLICATIONS

This application claims the benefit of priority to Japanese Patent Application 2015-189058 filed Sep. 26, 2015. The entire contents of this application are hereby incorporated by reference herein.

BACKGROUND OF THE INVENTION

1. Field of the Invention

The present invention relates to laminated LC filters, and specifically relates to a laminated LC filter that has a wide pass band and an attenuation pole with sufficient attenuation near the pass band.

2. Description of the Related Art

As an LC filter that is suitable to achieve miniaturization and weight-saving and has excellent characteristics, a laminated LC filter is widely used in which LC parallel resonators defined by inductors and capacitors are configured in a multistage configuration inside a multilayer body where a plurality of dielectric layers are laminated; the inductors and capacitors of the LC parallel resonators are provided in the multilayer body using line electrodes, capacitor electrodes, ground electrodes, and via electrodes.

Laminated LC filters are required to have optimum frequency characteristics in accordance with desired usage thereof.

As such a laminated LC filter, a laminated LC filter (laminated band pass filter) is disclosed in International Publication No. WO 2012/077498.

FIG. 7 illustrates a laminated LC filter 1100 disclosed in International Publication No. WO 2012/077498. FIG. 7 is an exploded perspective view of the laminated LC filter 1100. FIG. 8 is an equivalent circuit diagram of the laminated LC filter 1100.

The laminated LC filter 1100 includes a multilayer body 101 in which 15 layers of dielectric layers 101a through 101o are laminated in sequence from the bottom to the top.

Input-output terminals (input terminals) 102a and 102b are respectively provided on both end surfaces of the dielectric layer 101a. Further, capacitor electrodes 103a and 103b and a ground electrode (earth electrode) 104a are provided on an upper-side main surface of the dielectric layer 101a. The capacitor electrode 103a is connected to the input-output terminal 102a and the capacitor electrode 103b is connected to the input-output terminal 102b.

Although not shown in FIG. 7, one end of each of the input-output terminals 102a and 102b extends to a lower-side main surface of the dielectric layer 101a.

The input-output terminals 102a and 102b are also provided on both end surfaces of each of the dielectric layers 101b through 101o to be explained later. However, to simplify the drawings and the explanation thereof, assignment of reference signs in the drawings and description in the specification are omitted in some cases.

Capacitor electrodes 103c and 103d are provided on an upper-side main surface of the dielectric layer 101b. Further, via electrodes 105a and 105b extend through both of the main surfaces of the dielectric layer 101b. The capacitor electrode 103c is connected to the input-output terminal 102a and the capacitor electrode 103d is connected to the input-output terminal 102b. The via electrodes 105a and 105b are both connected to the ground electrode 104a.

A ground electrode 104b is provided on an upper-side main surface of the dielectric layer 101c. In addition, via electrodes 105c and 105d extend through both of the main surfaces of the dielectric layer 101c. The ground electrode 104b is connected to the via electrodes 105c and 105d. Further, the via electrode 105c is connected to the via electrode 105a and the via electrode 105d is connected to the via electrode 105b.

Capacitor electrodes 103e and 103f are provided on an upper-side main surface of the dielectric layer 101d. In addition, six via electrodes 105e through 105j extend through both of the main surfaces of the dielectric layer 101d. The capacitor electrode 103e is connected to the input-output terminal 102a and the capacitor electrode 103f is connected to the input-output terminal 102b. The six via electrodes 105e through 105j are all connected to the ground electrode 104b.

A capacitor electrode 103g is provided on an upper-side main surface of the dielectric layer 101e. In addition, six via electrodes 105k through 105p extend through both of the main surfaces of the dielectric layer 101e. The via electrode 105k is connected to the via electrode 105e, the via electrode 105l is connected to the via electrode 105f, the via electrode 105m is connected to the via electrode 105g, the via electrode 105n is connected to the via electrode 105h, the via electrode 105o is connected to the via electrode 105i, and the via electrode 105p is connected to the via electrode 105j.

Capacitor electrodes 103h and 103i are provided on an upper-side main surface of the dielectric layer 101f. In addition, six via electrodes 105q through 105v extend through both of the main surfaces of the dielectric layer 101f. The capacitor electrode 103h is connected to the input-output terminal 102a and the capacitor electrode 103i is connected to the input-output terminal 102b. Further, the via electrode 105q is connected to the via electrode 105k, the via electrode 105r is connected to the via electrode 105l, the via electrode 105s is connected to the via electrode 105m, the via electrode 105t is connected to the via electrode 105n, the via electrode 105u is connected to the via electrode 105o, and the via electrode 105v is connected to the via electrode 105p.

A ground electrode 104c is provided on an upper-side main surface of the dielectric layer 101g. In addition, six via electrodes 105w through 105ab extend through both of the main surfaces of the dielectric layer 101g. The ground electrode 104c is connected to the six via electrodes 105w through 105ab. Further, the via electrode 105w is connected to the via electrode 105q, the via electrode 105x is connected to the via electrode 105r, the via electrode 105y is connected to the via electrode 105s, the via electrode 105z is connected to the via electrode 105t, the via electrode 105aa is connected to the via electrode 105u, and the via electrode 105ab is connected to the via electrode 105v.

In this specification, when reference signs are assigned to certain constituent elements, where the number of the stated constituent elements is no more than 26, alphabetical letters "a" through "z" are used; where the number thereof exceeds 26, combinations of an alphabetical letter "a" and alphabetical letters "a" through "z" are used; where the number thereof further exceeds another 26, combinations of an alphabetical letter "b" and alphabetical letters "a" through "z" are used. For example, a total of 69 via electrodes are provided in the laminated LC filter 1100, and these via electrodes are represented by using reference signs 105a through 105z, 105aa through 105az, and 105ba through 105bu, respectively.

Capacitor electrodes 103*j* and 103*k* are provided on an upper-side main surface of the dielectric layer 101*h*. Further, five via electrodes 105*ac* through 105*ag* extend through both of the main surfaces of the dielectric layer 101*h*. The five via electrodes 105*ac* through 105*ag* are all connected to the ground electrode 104*c*.

Capacitor electrodes 103*l* and 103*m* are provided on an upper-side main surface of the dielectric layer 101*i*. In addition, seven via electrodes 105*ah* through 105*an* extend through both of the main surfaces of the dielectric layer 101*i*. The capacitor electrode 103*l* is connected to the via electrode 105*aj* and the capacitor electrode 103*m* is connected to the via electrode 105*al*. Further, the via electrode 105*ah* is connected to the capacitor electrode 103*j*, the via electrode 105*ai* is connected to the via electrode 105*ac*, the via electrode 105*aj* is connected to the via electrode 105*ad*, the via electrode 105*ak* is connected to the via electrode 105*ae*, the via electrode 105*al* is connected to the via electrode 105*af*, the via electrode 105*am* is connected to the via electrode 105*ag*, and the via electrode 105*an* is connected to the capacitor electrode 103*k*.

Capacitor electrodes 103*n* and 103*o* are provided on an upper-side main surface of the dielectric layer 101*j*. In addition, five via electrodes 105*ao* through 105*as* extend through both of the main surfaces of the dielectric layer 101*j*. The capacitor electrode 103*n* is connected to the via electrode 105*ao* and the capacitor electrode 103*o* is connected to the via electrode 105*as*. Further, the via electrode 105*ao* is connected to the via electrode 105*ah*, the via electrode 105*ap* is connected to the via electrode 105*ai*, the via electrode 105*aq* is connected to the via electrode 105*ak*, the via electrode 105*ar* is connected to the via electrode 105*am*, and the via electrode 105*as* is connected to the via electrode 105*an*.

Line electrodes 106*a* and 106*b* are provided on an upper-side main surface of the dielectric layer 101*k*. Further, five via electrodes 105*at* through 105*ax* extend through both of the main surfaces of the dielectric layer 101*k*. One end of the line electrode 106*a* is connected to the input-output terminal 102*a* and one end of the line electrode 106*b* is connected to the input-output terminal 102*b*. The via electrode 105*at* is connected to the capacitor electrode 103*n*, the via electrode 105*au* is connected to the via electrode 105*ap*, the via electrode 105*av* is connected to the via electrode 105*aq*, the via electrode 105*aw* is connected to the via electrode 105*ar*, and the via electrode 105*ax* is connected to the capacitor electrode 103*o*.

Line electrodes 106*c* and 106*d* are provided on an upper-side main surface of the dielectric layer 101*l*. Further, seven via electrodes 105*ay* through 105*be* extend through both of the main surfaces of the dielectric layer 101*l*. One end of the line electrode 106*c* and one end of the line electrode 106*d* are both connected to the via electrode 105*bb*. The via electrode 105*ay* is connected to the other end of the line electrode 106*a*, the via electrode 105*az* is connected to the via electrode 105*at*, the via electrode 105*ba* is connected to the via electrode 105*au*, the via electrode 105*bb* is connected to the via electrode 105*av*, the via electrode 105*bc* is connected to the via electrode 105*aw*, the via electrode 105*bd* is connected to the via electrode 105*ax*, and the via electrode 105*be* is connected to the other end of the line electrode 106*b*.

Four line electrodes 106*e* through 106*h* are provided on an upper-side main surface of the dielectric layer 101*m*. In addition, eight via electrodes 105*bf* through 105*bm* extend through both of the main surfaces of the dielectric layer 101*m*. One end of the line electrode 106*e* is connected to the via electrode 105*bf*, the other end of the line electrode 106*e* is connected to the via electrode 105*bj*, one end of the line electrode 106*f* is connected to the via electrode 105*bg*, the other end of the line electrode 106*f* is connected to the via electrode 105*bi*, one end of the line electrode 106*g* is connected to the via electrode 105*bj*, the other end of the line electrode 106*g* is connected to the via electrode 105*bl*, one end of the line electrode 106*h* is connected to the via electrode 105*bk*, and the other end of the line electrode 106*h* is connected to the via electrode 105*bm*. Further, the via electrode 105*bf* is connected to the via electrode 105*ay*, the via electrode 105*bg* is connected to the via electrode 105*az*, the via electrode 105*bh* is connected to the via electrode 105*ba*, the via electrode 105*bi* is connected to the other end of the line electrode 106*c*, the via electrode 105*bj* is connected to the other end of the line electrode 106*d*, the via electrode 105*bk* is connected to the via electrode 105*bc*, the via electrode 105*bl* is connected to the via electrode 105*bd*, and the via electrode 105*bm* is connected to the via electrode 105*be*.

Four line electrodes 106*i* through 106*l* are provided on an upper-side main surface of the dielectric layer 101*n*. In addition, eight via electrodes 105*bn* through 105*bu* extend through both of the main surfaces of the dielectric layer 101*n*. One end of the line electrode 106*i* is connected to the via electrode 105*bn*, the other end of the line electrode 106*i* is connected to the via electrode 105*bp*, one end of the line electrode 106*j* is connected to the via electrode 105*bo*, the other end of the line electrode 106*j* is connected to the via electrode 105*bq*, one end of the line electrode 106*k* is connected to the via electrode 105*br*, the other end of the line electrode 106*k* is connected to the via electrode 105*bt*, one end of the line electrode 106*l* is connected to the via electrode 105*bs*, and the other end of the line electrode 106*l* is connected to the via electrode 105*bu*. Further, the via electrode 105*bn* is connected to the one end of the line electrode 106*e*, the via electrode 105*bo* is connected to the one end of the line electrode 106*f*, the via electrode 105*bp* is connected to the other end of the line electrode 106*e*, the via electrode 105*bq* is connected to the other end of the line electrode 106*f*, the via electrode 105*br* is connected to the one end of the line electrode 106*g*, the via electrode 105*bs* is connected to the one end of the line electrode 106*l*, the via electrode 105*bt* is connected to the other end of the line electrode 106*g*, and the via electrode 105*bu* is connected to the other end of the line electrode 106*h*.

The input-output terminals 102*a* and 102*b* are provided on both end surfaces of the dielectric layer 101*o*. One end of each of the input-output terminals 102*a* and 102*b* extends to an upper-side main surface of the dielectric layer 101*o*.

As discussed above, in the laminated LC filter 1100, the input-output terminals 102*a* and 102*b* are provided on the surface of the multilayer body 101. Inside the multilayer body 101, the capacitor electrodes 103*a* through 103*o*, the ground electrodes 104*a* through 104*c*, the via electrodes 105*a* through 105*bu*, and the line electrodes 106*a* through 106*l* are provided.

The laminated LC filter 1100 disclosed in International Publication No. WO 2012/077498 has the above-discussed structure and has an equivalent circuit as shown in FIG. 8.

The laminated LC filter 1100 is configured such that four LC parallel resonators Re1 through Re4 are inserted between the ground and a signal line connecting the input-output terminals 102*a* and 102*b*.

An inductor L1 and a capacitor C1 are connected in parallel in the first-stage LC parallel resonator Re1.

An inductor L2 and a capacitor C2 are connected in parallel in the second-stage LC parallel resonator Re2.

An inductor L3 and a capacitor C3 are connected in parallel in the third-stage LC parallel resonator Re3.

An inductor L4 and a capacitor C4 are connected in parallel in the fourth-stage LC parallel resonator Re4.

Note that the inductor L2 in the second-stage LC parallel resonator Re2 and the inductor L3 in the third-stage LC parallel resonator Re3 are connected to each other and then connected to the ground through a common inductor L23.

A capacitor C14 is connected, in parallel to the signal line, between the input-output terminals 102a and 102b.

With reference to FIGS. 7 and 8, a relationship between the structure and the equivalent circuit of the laminated LC filter 1100 will be described next.

In a laminated LC filter, to improve a Q value, multi-layered line electrodes having a plurality of layers are provided in some cases. As such, in the laminated LC filter 1100, the one end of the line electrode 106e and the one end of the line electrode 106i are connected through the via electrode 105bn while the other ends thereof are connected through the via electrode 105bp, such that the line electrodes 106e and 106i are multi-layered. Similarly, the one end of the line electrode 106f and the one end of the line electrode 106j are connected with the via electrode 105bo while the other ends thereof are connected through the via electrode 105bq, such that the line electrodes 106f and 106j are multi-layered. Further, the one end of the line electrode 106g and the one end of the line electrode 106k are connected through the via electrode 105br while the other ends thereof are connected through the via electrode 105bt, such that the line electrodes 106g and 106k are multi-layered. Furthermore, the one end of the line electrode 106h and the one end of the line electrode 106l are connected through the via electrode 105bs while the other ends thereof are connected through the via electrode 105bu, such that the line electrodes 106h and 106l are multi-layered.

The inductor L1 in the first-stage LC parallel resonator Re1 is defined by a loop connecting the input-output terminal 102a, the line electrode 106a, the via electrode 105ay, the via electrode 105bf, the line electrode 106e and the line electrode 106i that are connected to one another through the via electrode 105bn and the via electrode 105bp, the via electrode 105bh, the via electrode 105ba, the via electrode 105au, the via electrode 105ap, the via electrode 105ai, the via electrode 105ac, and the ground electrode 104c.

The capacitor C1 in the first-stage LC parallel resonator Re1 is primarily defined by a capacitance produced between the ground electrode 104b and the capacitor electrodes 103c and 103e, and a capacitance produced between the capacitor electrode 103h and the ground electrode 104c. The capacitor electrodes 103c, 103e, and 103h are all connected to the input-output terminal 102a.

The inductor L1 and the capacitor C1 in the first-stage LC parallel resonator Re1 are not directly connected to one another, but are indirectly connected through the input-output terminal 102a.

The inductor L2 in the second-stage LC parallel resonator Re2 is defined by a loop connecting the capacitor electrode 103j and capacitor electrode 103n connected to each other through the via electrode 105ah and via electrode 105ao, the via electrode 105at, the via electrode 105az, the via electrode 105bg, the line electrode 106e and the line electrode 106i connected to one another through the via electrode 105bo and the via electrode 105bq, the via electrode 105bi, and the line electrode 106c.

The capacitor C2 in the second-stage LC parallel resonator Re2 is primarily defined by a capacitance produced between the capacitor electrodes 103j and 103n, and the ground electrode 104c and the capacitor electrode 103l. Note that the capacitor electrodes 103j and 103n are connected through the via electrodes 105ah and 105ao as discussed above. Further, the capacitor electrode 103l is connected to the ground electrode 104c through the via electrodes 105aj and 105ad.

The inductor L3 in the third-stage LC parallel resonator Re3 is defined by a loop connecting the capacitor electrode 103k and capacitor electrode 103o connected to each other through the via electrode 105an and via electrode 105as, the via electrode 105ax, the via electrode 105bd, the via electrode 105bl, the line electrode 106g and line electrode 106k are connected to one another through the via electrode 105br and via electrode 105bt, the via electrode 105bj, and the line electrode 106d.

The capacitor C3 in the third-stage LC parallel resonator Re3 is primarily defined by a capacitance produced between the capacitor electrodes 103k and 103o, and the ground electrode 104c and the capacitor electrode 103m. Note that the capacitor electrodes 103k and 103o are connected through the via electrodes 105an and 105as as discussed above. Further, the capacitor electrode 103m is connected to the ground electrode 104c through the via electrodes 105al and 105af.

The inductor L4 in the fourth-stage LC parallel resonator Re4 is defined by a loop connecting the input-output terminal 102b, the line electrode 106b, the via electrode 105be, the via electrode 105bm, the line electrode 106h and line electrode 106l connected to each other through the via electrode 105bs and via electrode 105bu, the via electrode 105bk, the via electrode 105bc, the via electrode 105aw, the via electrode 105ar, the via electrode 105am, the via electrode 105ag, and the ground electrode 104c.

The capacitor C4 in the fourth-stage LC parallel resonator Re4 is primarily defined by a capacitance produced between the ground electrode 104b and the capacitor electrodes 103d and 103f, and a capacitance produced between the capacitor electrode 103i and the ground electrode 104c. Note that the capacitor electrodes 103d, 103f, and 103i are all connected to the input-output terminal 102a.

The inductor L4 and the capacitor C4 in the fourth-stage LC parallel resonator Re4 are not directly connected, but are indirectly connected through the input-output terminal 102b.

As discussed above, the inductor L2 in the second-stage LC parallel resonator Re2 and the inductor L3 in the third-stage LC parallel resonator Re3 are connected to each other and then connected to the ground through the common inductor L23. The common inductor L23 is defined by a path connecting the via electrodes 105bb, 105av, 105aq, 105ak, and 105ae, and is connected to the ground electrode 104c. Note that the common inductor L23 can be considered to be a portion of the inductor L2 in the second-stage LC parallel resonator Re2 and also a portion of the inductor L3 in the third-stage LC parallel resonator Re3.

The capacitor C14 is primarily defined by a capacitance produced by the capacitor electrodes 103e and 103h, the capacitor electrode 103g as a floating electrode, and the capacitor electrodes 103f and 103i.

In the laminated LC filter 1100, the loop of the inductor L1 in the first-stage LC parallel resonator Re1 and the loop of the inductor L2 in the second-stage LC parallel resonator Re2 are disposed in parallel, and the winding directions thereof are the same. As such, the inductor L1 and the inductor L2 are coupled by magnetic coupling M12.

Similarly, the loop of the inductor L3 in the third-stage LC parallel resonator Re3 and the loop of the inductor L4 in the fourth-stage LC parallel resonator Re4 are disposed in parallel, and the winding directions thereof are the same. As such, the inductor L3 and the inductor L4 are coupled by magnetic coupling M34.

The loop of the inductor L2 in the second-stage LC parallel resonator Re2 and the loop of the inductor L3 in the third-stage LC parallel resonator Re3 are parallel to each other, but are obliquely disposed and the winding directions thereof are different from each other. Therefore, the strength of magnetic coupling therebetween is weak. As such, in the laminated LC filter 1100, the inductor L2 and the inductor L3 are connected to each other and then connected to the ground through the common inductor L23, so as to obtain magnetic coupling M23 between the inductor L2 and the inductor L3.

Detailed description about this will be provided below. That is, in the laminated LC filter 1100, an attenuation pole is provided near the pass band by making the winding direction of the loop of the inductor L2 and the winding direction of the loop of the inductor L3 to differ from each other, so as to make it possible to obtain high attenuation characteristics. However, when the winding direction of the loop of the inductor L2 and the winding direction of the loop of the inductor L3 are different, the strength of magnetic coupling between the inductor L2 and the inductor L3 is weak and, consequently, the pass band is narrowed. As such, in the laminated LC filter 1100, as discussed above, the inductors L2 and L3 are connected to each other and then connected to the ground through the common inductor L23, such that the magnetic coupling M23 between the inductors L2 and L3 is strengthened and the pass band is widened.

The first-stage LC parallel resonator Re1 and the fourth-stage LC parallel resonator Re4 are capacitively coupled through the capacitor C14, that is, coupled to each other while bypassing the other LC parallel resonators.

FIG. 9 illustrates frequency characteristics of the laminated LC filter 1100 disclosed in International Publication No. WO 2012/077498.

In the laminated LC filter 1100 disclosed in International Publication No. WO 2012/077498, the inductors L2 and L3 are connected to each other and then connected to the ground through the common inductor L23 as shown in FIG. 8, such that the magnetic coupling M23 between the inductors L2 and L3 is strengthened and the pass band is widened as shown in FIG. 9.

However, in the laminated LC filter 1100, because the inductors L2 and L3 are connected to each other and then connected to the ground through the common inductor L23, attenuation of attenuation poles near the pass band, especially attenuation of the attenuation pole on a higher frequency side of the pass band is insufficient, as shown in FIG. 9, so that high attenuation characteristics cannot be obtained.

SUMMARY OF THE INVENTION

Preferred embodiments of the present invention provide a laminated LC filter that has high attenuation characteristics by providing an attenuation pole with sufficient attenuation near a pass band, so as to overcome the above-mentioned problem while maintaining a wide pass band.

A laminated LC filter according to a preferred embodiment of the present invention includes a multilayer body in which a plurality of dielectric layers are laminated; a plurality of line electrodes laminated between layers in the plurality of dielectric layers; a plurality of capacitor electrodes laminated between layers in the plurality of dielectric layers; at least one ground electrode laminated between layers in the plurality of dielectric layers; and a plurality of via electrodes extending through both main surfaces of layers in the plurality of dielectric layers. At least four LC parallel resonators are provided inside the multilayer body. An inductor and a capacitor are connected in parallel in each of the LC parallel resonators. The inductor is defined by a capacitor-side via electrode portion which includes at least one via electrode and one end of which is connected to a capacitor electrode, a line electrode portion which includes at least one line electrode and one end of which is connected to the other end of the capacitor-side via electrode portion, and a ground-side via electrode portion which includes at least one via electrode, one end of which is connected to the other end of the line electrode portion, and the other end of which is connected to the ground electrode. Further, the inductor includes a loop having a predetermined winding direction and connecting the capacitor-side via electrode portion, the line electrode portion, and the ground-side via electrode portion. The capacitor is defined by a capacitance produced between the capacitor electrode and the ground electrode or a capacitance produced among the plurality of capacitor electrodes. The loops of the inductors of at least a pair of the LC parallel resonators in at least one of a pair of odd numbered-stage LC parallel resonators and a pair of even numbered-stage LC parallel resonators among at least the four LC parallel resonators are disposed at an angle at which magnetic coupling is obtained between each other, and winding directions of the loops of the inductors are the same. The pair of loops which are disposed at an angle at which magnetic coupling is obtained between each other and whose winding directions are the same refers to the loop of the inductor in the first-stage LC parallel resonator and the loop of the inductor in the third-stage LC parallel resonator, or the loop of the inductor in the second-stage LC parallel resonator and the loop of the inductor in the fourth-stage LC parallel resonator. The winding directions of the loop of the inductor in the second-stage LC parallel resonator and the loop of the inductor in the third-stage LC parallel resonator are different from each other. The ground-side via electrode portion of the inductor in the second-stage LC parallel resonator and the ground-side via electrode portion of the inductor in the third-stage LC parallel resonator are integrated so as to define a common ground-side via portion, and the common ground-side via portion is connected to the ground electrode.

The inductor loops of the inductors in the first-stage and third-stage LC parallel resonators as well as the inductor loops of the inductors in the second-stage and fourth-stage LC parallel resonators may preferably be each disposed at an angle at which magnetic coupling is obtained between each other and the winding directions thereof may be the same. In this case, an attenuation pole having further improved attenuation is provided near the pass band, particularly on a higher frequency side relative to the pass band, thus making it possible to obtain high attenuation characteristics.

The line electrode portion of the inductor in the second-stage LC parallel resonator and the line electrode portion of the inductor in the third-stage LC parallel resonator may preferably each be multi-layered and include a plurality of layers of the line electrode portion, and the line electrode portion of the inductor in the second-stage LC parallel resonator and the line electrode portion of the inductor in the third-stage LC parallel resonator may preferably be directly connected or connected through the line electrode in each layer. Alternatively, the line electrode portion of the inductor in the second-stage LC parallel resonator and the line electrode portion of the inductor in the third-stage LC parallel resonator may preferably each be a single-layered line electrode portion, and the line electrode portion of the inductor in the second-stage LC parallel resonator and the line electrode portion of the inductor in the third-stage LC parallel resonator may preferably be directly connected or connected through the line electrode. In these cases, the magnetic coupling between the inductor in the second-stage LC parallel resonator and the inductor in the third-stage LC parallel resonator is further strengthened as compared to when the inductor in the second-stage LC parallel resonator and the inductor in the third-stage LC parallel resonator are integrated to be at least partially common halfway and connected to the ground, so as to further widen the pass band.

Of the two examples of preferred embodiments of the present invention described above, when the line electrode portions of the inductors are each multi-layered and include a plurality of layers, an improved Q value of the inductor is also achieved.

According to a laminated LC filter of a preferred embodiment of the present invention, an attenuation pole having sufficient attenuation is provided near a pass band while maintaining a wide pass band, such that high attenuation characteristics is obtained.

More specifically, at least a pair of inductor loops in at least one of a pair of odd numbered-stage LC parallel resonators and a pair of even numbered-stage LC parallel resonators is disposed at an angle at which magnetic coupling is obtained between each other, and winding directions of the inductor loops are the same. This makes it possible for the inductors in the LC parallel resonators to be strongly magnetically coupled to each other. As a result, an attenuation pole having sufficient attenuation is provided near the pass band, specifically on a higher frequency side relative to the pass band, so that high attenuation characteristics are obtained.

Further, the ground-side via electrode portion of the inductor in the second-stage LC parallel resonator and the ground-side via electrode portion of the inductor in the third-stage LC parallel resonator are integrated to define the common ground-side via portion, and the common ground-side via portion is connected to the ground electrode. As such, although the winding direction of the inductor loop in the second-stage LC parallel resonator is opposite to the winding direction of the inductor loop of the third-stage LC parallel resonator, the inductor in the second-stage LC parallel resonator and the inductor in the third-stage LC parallel resonator are magnetically coupled, thereby widening the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
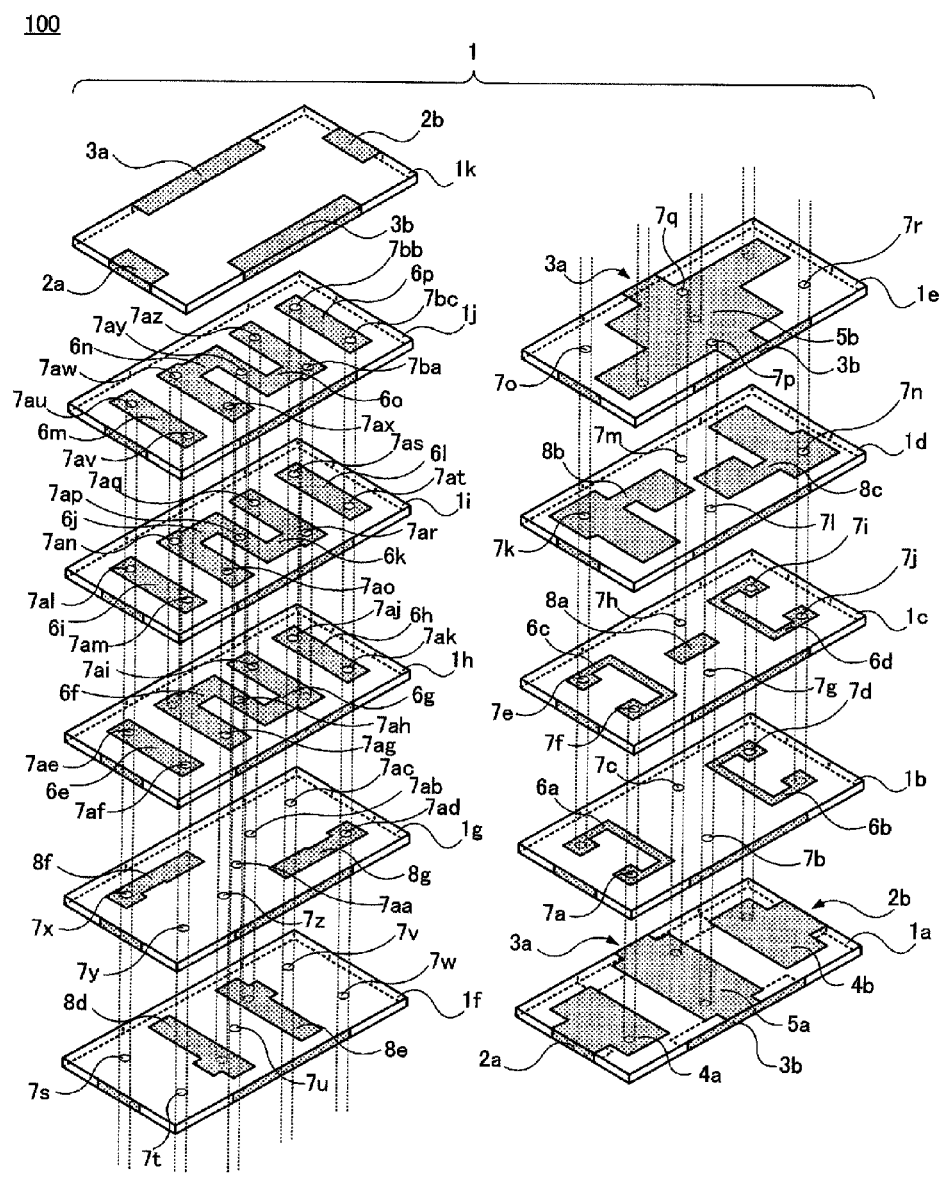
FIG. 1 is an exploded perspective view illustrating a laminated LC filter 100 according to a first preferred embodiment of the present invention.

Hereinafter, preferred embodiments of the present invention will be described with reference to the drawings.

The preferred embodiments described herein are merely examples, and therefore the present invention is not limited to the contents of the preferred embodiments in any way. Further, contents described in the different preferred embodiments can be combined with one another. In this case, the combined contents of such a preferred embodiment are also included in the present invention. It is to be noted that the drawings are prepared to facilitate the understanding of the preferred embodiments and are not precisely illustrated in some cases. For example, there is a case in which dimensional ratios of the illustrated constituent elements or dimensional ratios between the illustrated constituent elements are not equal to those described in the specification. Further, there are cases in which constituent elements illustrated in the specification are omitted in the drawings, a smaller number of constituent elements than an actual number thereof are illustrated in the drawings, and other differences.

First Preferred Embodiment

Figure 2:
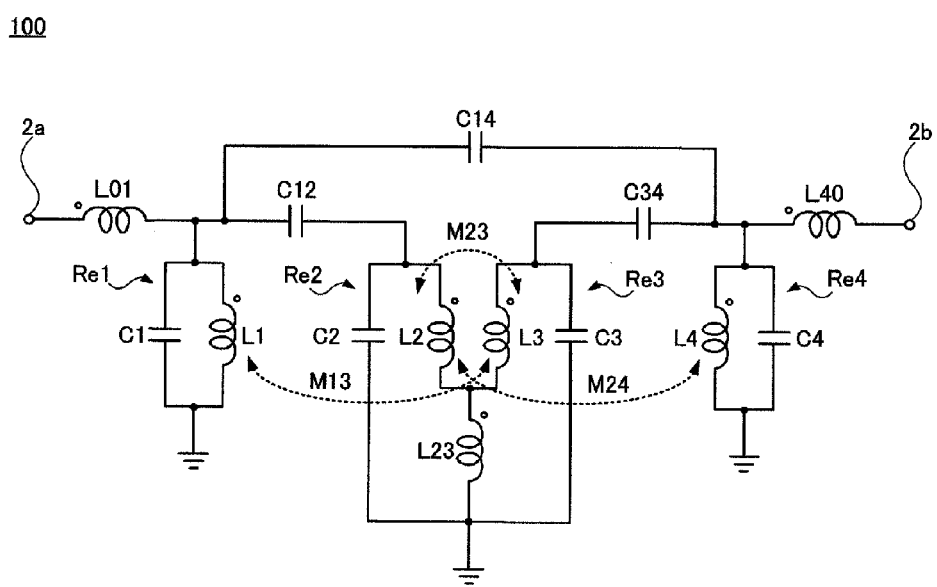
FIG. 2 is an equivalent circuit diagram of the laminated LC filter 100.

A laminated LC filter 100 according to a first preferred embodiment of the present invention is shown in FIGS. 1 and 2. FIG. 1 is an exploded perspective view of the laminated LC filter 100. FIG. 2 is an equivalent circuit diagram of the laminated LC filter 100.

The laminated LC filter 100 includes a multilayer body 1 in which dielectric layers 1a through 1k are laminated in eleven layers, for example, in sequence from the bottom to the top. Ceramics are preferably used for the multilayer body 1 (dielectric layers 1a-1k), for example.

A pair of input-output terminals 2a and 2b are provided on end surfaces of the dielectric layer 1a that oppose each other. Ground terminals 3a and 3b are provided on side surfaces of the dielectric layer 1a that oppose each other.

Connection electrodes 4a, 4b and a ground electrode 5a are provided on an upper-side main surface of the dielectric layer 1a. The connection electrode 4a is connected to the input-output terminal 2a and the connection electrode 4b is connected to the input-output terminal 2b. The ground electrode 5a is connected to both of the ground terminals 3a and 3b.

One end of each of the input-output terminals 2a, 2b and the ground terminals 3a, 3b extends to a lower-side main surface of the dielectric layer 1a.

The input-output terminals 2a, 2b and the ground terminals 3a, 3b are also provided on end surfaces and side surfaces, respectively, of the dielectric layers 1b through 1k as will be explained below. However, in order to facilitate understanding of the drawings and to simplify the explanation thereof, the assignment of reference signs in the drawings and the description thereof in the specification are omitted in some cases.

Line electrodes 6a and 6b are provided on an upper-side main surface of the dielectric layer 1b. Further, four via electrodes 7a through 7d extend through both of the main surfaces of the dielectric layer 1b. One end of the line electrode 6a is connected to the via electrode 7a and one end of the line electrode 6b is connected to the via electrode 7d. Further, the via electrode 7a is connected to the connection electrode 4a and the via electrode 7d is connected to the connection electrode 4b. The via electrodes 7b and 7c are both connected to the ground electrode 5a.

Line electrodes 6c, 6d and a capacitor electrode 8a are provided on an upper-side main surface of the dielectric layer 1c. Six via electrodes 7e through 7j extend through both of the main surfaces of the dielectric layer 1c. One end of the line electrode 6c is connected to the via electrode 7f, the other end of the line electrode 6c is connected to the via electrode 7e, one end of the line electrode 6d is connected to the via electrode 7i, and the other end of the line electrode 6d is connected to the via electrode 7j. Further, the via electrode 7f is connected to the one end of the line electrode 6a, the via electrode 7e is connected to the other end of the line electrode 6a, the via electrode 7g is connected to the via electrode 7b, the via electrode 7h is connected to the via electrode 7c, the via electrode 7i is connected to the one end of the line electrode 6b, and the via electrode 7j is connected to the other end of the line electrode 6b.

Capacitor electrodes 8b and 8c are provided on an upper-side main surface of the dielectric layer 1d. Further, four via electrodes 7k through 7n extend through both of the main surfaces of the dielectric layer 1d. The capacitor electrode 8b is connected to the via electrode 7k and the capacitor electrode 8c is connected to the via electrode 7n. Further, the via electrode 7k is connected to the other end of the line electrode 6c, the via electrode 7l is connected to the via electrode 7g, the via electrode 7m is connected to the via electrode 7h, and the via electrode 7n is connected to the other end of the line electrode 6d.

A ground electrode 5b is provided on an upper-side main surface of the dielectric layer 1e. Further, four via electrodes 7o through 7r extend through both of the main surfaces of the dielectric layer 1e. The ground electrode 5b is connected to the via electrode 7p and the via electrode 7q. The via electrode 7o is connected to the capacitor electrode 8b, the via electrode 7p is connected to the via electrode 7l, the via electrode 7q is connected to the via electrode 7m, and the via electrode 7r is connected to the capacitor electrode 8c.

Capacitor electrodes 8d and 8e are provided on an upper-side main surface of the dielectric layer 1f. In addition, five via electrodes 7s through 7w extend through both of the main surfaces of the dielectric layer 1f. The via electrode 7s is connected to the via electrode 7o, three via electrodes 7t, 7u, and 7v are all connected to the ground electrode 5b, and the via electrode 7w is connected to the via electrode 7r.

Capacitor electrodes 8f and 8g are provided on an upper-side main surface of the dielectric layer 1g. In addition, seven via electrodes 7x through 7ad extend through both of the main surfaces of the dielectric layer 1g. The capacitor electrode 8f is connected to the via electrode 7x and the capacitor electrode 8g is connected to the via electrode 7ad. Further, the via electrode 7x is connected to the via electrode 7s, the via electrode 7y is connected to the via electrode 7t, the via electrode 7z is connected to the capacitor electrode 8d, the via electrode 7aa is connected to the via electrode 7u, the via electrode 7ab is connected to the capacitor electrode 8e, the via electrode 7ac is connected to the via electrode 7v, and the via electrode 7ad is connected to the via electrode 7w.

Four line electrodes 6e through 6h are provided on an upper-side main surface of the dielectric layer 1h. Further, seven via electrodes 7ae through 7ak extend through both of the main surfaces of the dielectric layer 1h. Then, one end of the line electrode 6e is connected to the via electrode 7ae, the other end of the line electrode 6e is connected to the via electrode 7af, one end of the line electrode 6f is connected to the via electrode 7ag, the other end of the line electrode 6f is connected to the via electrode 7ah, one end of the line electrode 6g is connected to the via electrode 7ai, the other end of the line electrode 6g is connected to the via electrode 7ah, one end of the line electrode 6h is connected to the via electrode 7ak, and the other end of the line electrode 6h is connected to the via electrode 7aj. Note that the other end of the line electrode 6f and the other end of the line electrode 6g are both connected to the via electrode 7ah. The via electrode 7ae is connected to the capacitor electrode 8f, the via electrode 7af is connected to the via electrode 7y, the via electrode 7ag is connected to the via electrode 7z, the via electrode 7ah is connected to the via electrode 7aa, the via electrode 7ai is connected to the via electrode 7ab, the via electrode 7aj is connected to the via electrode 7ac, and the via electrode 7ak is connected to the capacitor electrode 8g.

On an upper-side main surface of the dielectric layer 1i, four line electrodes 6i through 6l are provided. In addition, nine via electrodes 7al through 7at extend through both of the main surfaces of the dielectric layer 1i. One end of the line electrode 6i is connected to the via electrode 7al, the other end of the line electrode 6i is connected to the via electrode 7am, one end of the line electrode 6j is connected to the via electrode 7ao, an intermediate portion of the line electrode 6j is connected to the via electrode 7an, the other end of the line electrode 6j is connected to the via electrode 7ap, one end of the line electrode 6k is connected to the via electrode 7aq, an intermediate portion of the line electrode 6k is connected to the via electrode 7ar, the other end of the line electrode 6k is connected to the via electrode 7ap, one end of the line electrode 6l is connected to the via electrode 7at, and the other end of the line electrode 6l is connected to the via electrode 7as. Note that the other end of the line electrode 6j and the other end of the line electrode 6k are both connected to the via electrode 7ap. The via electrode 7al is connected to the one end of the line electrode 6e, the via electrode 7am is connected to the other end of the line electrode 6e, the via electrode 7ao is connected to the one end of the line electrode 6f, the via electrode 7an is connected to an intermediate portion of the line electrode 6f, the via electrode 7ap is connected to the other end of the line electrode 6f (this is also the other end of the line electrode 6g), the via electrode 7aq is connected to the one end of the line electrode 6g, the via electrode 7ar is connected to an intermediate portion of the line electrode 6g, the via electrode 7at is connected to the one end of the line electrode 6h, and the via electrode 7as is connected to the other end of the line electrode 6h.

On an upper-side main surface of the dielectric layer 1j, four line electrodes 6m through 6p are provided. Further, nine via electrodes 7au through 7bc extend through both of the main surfaces of the dielectric layer 1j. One end of the line electrode 6m is connected to the via electrode 7au, the other end of the line electrode 6m is connected to the via electrode 7av, one end of the line electrode 6n is connected to the via electrode 7ax, an intermediate portion of the line electrode 6n is connected to the via electrode 7aw, the other end of the line electrode 6n is connected to the via electrode 7ay, one end of the line electrode 6o is connected to the via electrode 7az, an intermediate portion of the line electrode 6o is connected to the via electrode 7ba, the other end of the line electrode 6o is connected to the via electrode 7ay, one end of the line electrode 6p is connected to the via electrode 7bc, and the other end of the line electrode 6p is connected to the via electrode 7bb. Note that the other end of the line electrode 6n and the other end of the line electrode 6o are both connected to the via electrode 7ay. The via electrode 7au is connected to the one end of the line electrode 6i, the via electrode 7av is connected to the other end of the line electrode 6i, the via electrode 7ax is connected to the one end of the line electrode 6j, the via electrode 7aw is connected to the intermediate portion of the line electrode 6j, the via electrode 7ay is connected to the other end of the line electrode 6j (this is also the other end of the line electrode 6k), the via electrode 7az is connected to the one end of the line electrode 6k, the via electrode 7ba is connected to the intermediate portion of the line electrode 6k, the via electrode 7bc is connected to the one end of the line electrode 6l, and the via electrode 7bb is connected to the other end of the line electrode 6l.

The pair of input-output terminals 2a and 2b is provided on the end surfaces of the dielectric layer 1k that oppose each other. In addition, the ground terminals 3a and 3b are provided on the side surfaces of the dielectric layer 1k that oppose each other. One end of each of the input-output terminals 2a, 2b and the ground terminals 3a, 3b extends to an upper-side main surface of the dielectric layer 1k.

As discussed above, in the laminated LC filter 100 according to the first preferred embodiment, the input-output terminals 2a, 2b and the ground terminals 3a, 3b are provided on the surface of the multilayer body 1. Inside the multilayer body 1, the connection electrodes 4a and 4b, the ground electrodes 5a and 5b, the line electrodes 6a through 6p, the via electrodes 7a through 7bc, and the capacitor electrodes 8a through 8g are provided.

A metal whose main component is Ag, Cu, or an alloy of these metals, for example, can preferably be used for the input-output terminals 2a, 2b and the ground terminals 3a, 3b. A plating layer whose main component is Ni, Sn, Au, or other suitable plating material, for example, may preferably be provided on the surface of the input-output terminals 2a, 2b and the ground terminals 3a, 3b as desired in either a single layer or a plurality of layers.

A metal whose main component is Ag, Cu, or an alloy of these metals, for example, can preferably be used for the connection electrodes 4a and 4b, the ground electrodes 5a and 5b, the line electrodes 6a through 6p, the via electrodes 7a through 7bc, and the capacitor electrodes 8a through 8g.

The laminated LC filter 100 according to the first preferred embodiment can be manufactured using a general manufacturing method having been used for the manufacture of laminated LC filters configured to include a multilayer body in which dielectric layers are laminated.

The laminated LC filter 100 having the above-described structure according to the first preferred embodiment has an equivalent circuit as shown in FIG. 2.

The laminated LC filter 100 is configured such that four LC parallel resonators Re1 through Re4 are inserted between the ground and a signal line connecting the input-output terminals 2a and 2b.

The first-stage LC parallel resonator Re1 includes an inductor L1 and a capacitor C1 connected in parallel.

The second-stage LC parallel resonator Re2 includes an inductor L2 and a capacitor C2 connected in parallel.

The third-stage LC parallel resonator Re3 includes an inductor L3 and a capacitor C3 connected in parallel.

The fourth-stage LC parallel resonator Re4 includes an inductor L4 and a capacitor C4 connected in parallel.

Note that the inductor L2 in the second-stage LC parallel resonator Re2 and the inductor L3 in the third-stage LC parallel resonator Re3 are connected to each other and then connected to the ground through a common inductor L23. The common inductor L23 can be considered to define a portion of the inductor L2 and also to define a portion of the inductor L3.

In the signal line connecting the input-output terminals 2a and 2b, an inductor L01 is provided between the input-output terminal 2a and the first-stage LC parallel resonator Re1.

In the signal line connecting the input-output terminals 2a and 2b, a capacitor C12 is provided between the first-stage LC parallel resonator Re1 and the second-stage LC parallel resonator Re2.

In the signal line connecting the input-output terminals 2a and 2b, a capacitor C34 is provided between the third-stage LC parallel resonator Re3 and the fourth-stage LC parallel resonator Re4.

In the signal line connecting the input-output terminals 2a and 2b, an inductor L40 is provided between the fourth-stage LC parallel resonator Re4 and the input-output terminal 2b.

A capacitor C14 is connected in parallel to a signal line connecting the capacitor C12, the second-stage LC parallel resonator Re2, the third-stage LC parallel resonator Re3, and the capacitor C34.

Next, a relationship between the structure and equivalent circuit of the laminated LC filter 100 will be described with reference to FIGS. 1 and 2.

As discussed in the "Description of the Related Art" above, in a laminated LC filter, in order to improve a Q value, line electrodes are configured to be multi-layered and to include a plurality of layers.

In the laminated LC filter 100, preferably, the one end of the line electrode 6a and the one end of the line electrode 6c are connected through the via electrode 7f while the other ends thereof are connected through the via electrode 7e, such that the line electrodes 6a and 6c are multi-layered and include two layers, for example.

Similarly, preferably, the one end of the line electrode 6b and the one end of the line electrode 6d are connected through the via electrode 7d while the other ends thereof are connected through the via electrode 7j, such the line electrodes 6b and 6d are multi-layered and include two layers, for example.

Further, preferably, the one ends of the line electrodes 6e, 6i, and 6m are connected through the via electrodes 7al and 7au while the other ends thereof are connected through the via electrodes 7*am* and 7*av*, such that the line electrodes 6*e*, 6*i*, and 6*m* are multi-layered and include three layers, for example.

Similarly, preferably, the one ends of the line electrodes 6*f*, 6*j*, and 6*n* are connected through the via electrodes 7*ao* and 7*ax*, the intermediate portions thereof are connected through the via electrodes 7*an* and 7*aw*, and the other ends thereof are connected through the via electrodes 7*ap* and 7*ay*, such that the line electrodes 6*f*, 6*j*, and 6*n* are multi-layered and include three layers, for example.

Similarly, preferably, the one ends of the line electrodes 6*g*, 6*k*, and 6*o* are connected through the via electrodes 7*aq* and 7*az*, the intermediate portions thereof are connected through the via electrodes 7*ar* and 7*ba*, and the other ends thereof are connected through the via electrodes 7*ap* and 7*ay*, such that the line electrodes 6*g*, 6*k*, and 6*o* are multi-layered and include three layers, for example.

Similarly, preferably, the one ends of the line electrodes 6*h*, 6*l*, and 6*p* are connected through the via electrodes 7*at* and 7*bc* while the other ends thereof are connected through the via electrodes 7*as* and 7*bb*, such that the line electrodes 6*h*, 6*l*, and 6*p* are multi-layered and include three layers, for example.

The inductor L01 is defined by a path connecting the input-output terminal 2*a*, the connection electrode 4*a*, the via electrode 7*a*, the line electrodes 6*a* and 6*c* connected through the via electrodes 7*e* and 7*f*, and the via electrode 7*k*. The inductor L01 is structured to improve attenuation on a higher frequency side, for example, attenuation near a frequency of approximately 12 GHz in FIG. 3 to be explained later.

The capacitor C12 is primarily defined by a capacitance provided between the capacitor electrode 8*f* and the capacitor electrode 8*d*.

The capacitor C34 is primarily defined by a capacitance produced between the capacitor electrode 8*e* and the capacitor electrode 8*g*.

The inductor L40 is defined by a path connecting the via electrode 7*n*, the line electrodes 6*b* and 6*d* connected through the via electrodes 7*i* and 7*j*, the via electrode 7*d*, the connection electrode 4*b*, and the input-output terminal 2*b*. The inductor L40 is structured to improve attenuation on the higher frequency side.

The capacitor C14 is primarily defined by a capacitance produced by the capacitor electrode 8*b*, the capacitor electrode 8*a* as a floating electrode, and the capacitor electrode 8*c*.

The inductor L1 in the first-stage LC parallel resonator Re1 is defined by a loop connecting a capacitor-side via electrode portion, a line electrode portion, and a ground-side via electrode portion.

The capacitor-side via electrode portion of the inductor L1 is defined by the via electrode 7*o* connected to the capacitor electrode 8*b*, the via electrode 7*s*, the via electrode 7*x*, the capacitor electrode 8*f*, and the via electrode 7*ae*.

The line electrode portion of the inductor L1 is defined by the line electrodes 6*e*, 6*i*, and 6*m* connected in three layers through the via electrodes 7*al*, 7*am*, 7*au*, and 7*av*.

The ground-side via electrode portion of the inductor L1 is defined by the via electrode 7*af*, the via electrode 7*y*, and the via electrode 7*t* connected to the ground electrode 5*b*.

The capacitor C1 in the first-stage LC parallel resonator Re1 is primarily defined by a capacitance produced between the capacitor electrode 8*b* and the ground electrode 5*b*.

As discussed above, the inductor L1 and the capacitor C1 in the first-stage LC parallel resonator Re1 are preferably connected in parallel to each other.

The inductor L2 in the second-stage LC parallel resonator Re2 and the common inductor L23 are defined by a loop connecting a capacitor-side via electrode portion, a line electrode portion, and a ground-side via electrode portion. As discussed above, the common inductor L23 can be considered to defined a portion of the inductor L2.

The capacitor-side via electrode portion of the inductor L2 is defined by the via electrode 7*z* connected to the capacitor electrode 8*d* and the via electrode 7*ag*.

The line electrode portion of the inductor L2 is defined by the line electrodes 6*f*, 6*j*, and 6*n* connected in three layers through the via electrodes 7*an*, 7*ao*, 7*ap*, 7*aw*, 7*ax*, and 7*ay*.

The ground-side via electrode portion of the inductor L2 is defined by the via electrodes 7*ah* and 7*aa*, and the via electrode 7*u* connected to the ground electrode 5*b*.

The capacitor C2 in the second-stage LC parallel resonator Re2 is primarily defined by a capacitance produced between the capacitor electrode 8*d* and the ground electrode 5*b*.

As discussed above, the inductor L2 and the capacitor C2 in the second-stage LC parallel resonator Re2 are preferably connected in parallel to each other.

The inductor L3 in the third-stage LC parallel resonator Re3 and the common inductor L23 are defined by a loop connecting a capacitor-side via electrode portion, a line electrode portion, and a ground-side via electrode portion. As discussed above, the common inductor L23 can be considered to defined a portion of the inductor L3.

The capacitor-side via electrode portion of the inductor L3 is defined by the via electrode 7*ab* connected to the capacitor electrode 8*e*, and the via electrode 7*ai*.

The line electrode portion of the inductor L3 is defined by the line electrodes 6*f*, 6*j*, and 6*n* connected in three layers through the via electrodes 7*ap*, 7*aq*, 7*ar*, 7*ay*, 7*az*, and 7*ba*.

The ground-side via electrode portion of the inductor L3 is defined by the via electrodes 7*ah* and 7*aa*, and the via electrode 7*u* connected to the ground electrode 5*b*.

The capacitor C3 in the third-stage LC parallel resonator Re3 is primarily defined by a capacitance produced between the capacitor electrode 8*e* and the ground electrode 5*b*.

As discussed above, the inductor L3 and the capacitor C3 in the third-stage LC parallel resonator Re3 are preferably connected in parallel to each other.

The inductor L4 in the fourth-stage LC parallel resonator Re4 is defined by a loop connecting a capacitor-side via electrode portion, a line electrode portion, and a ground-side via electrode portion.

The capacitor-side via electrode portion of the inductor L4 is defined by the via electrode 7*r* connected to the capacitor electrode 8*c*, the via electrode 7*w*, the via electrode 7*ad*, (capacitor electrode 8*g*), and the via electrode 7*ak*.

The line electrode portion of the inductor L4 is defined by the line electrodes 6*h*, 6*l*, and 6*p* connected in three layers through the via electrodes 7*as*, 7*at*, 7*bb*, and 7*bc*.

The ground-side via electrode portion of the inductor L4 is defined by the via electrode 7*aj*, the via electrode 7*ac*, and the via electrode 7*v* connected to the ground electrode 5*b*.

The capacitor C4 in the fourth-stage LC parallel resonator Re4 is primarily defined by a capacitance produced between the capacitor electrode 8*c* and the ground electrode 5*b*.

As discussed above, the inductor L4 and the capacitor C4 in the fourth-stage LC parallel resonator Re4 are preferably connected in parallel to each other.

In the laminated LC filter 100 according to the present preferred embodiment, the first-stage LC parallel resonator Re1 and the second-stage LC parallel resonator Re2 are primarily capacitively coupled to one another through the capacitor C12.

Further, in the laminated LC filter 100, the second-stage LC parallel resonator Re2 and the third-stage LC parallel resonators Re3 are coupled primarily through magnetic coupling between the inductor L2 and inductor L3 because the ground-side via electrode portion of the inductor L2 and the ground-side via electrode portion of the inductor L3 are integrated by the common inductor L23.

Although the winding directions of the loop of the inductor L2 and the loop of the inductor L3 are different from each other, the inductors L2 and L3 are coupled to each other by magnetic coupling M23 because both of the ground-side via electrode portions thereof are integrated by the common inductor L23.

Figure 7:
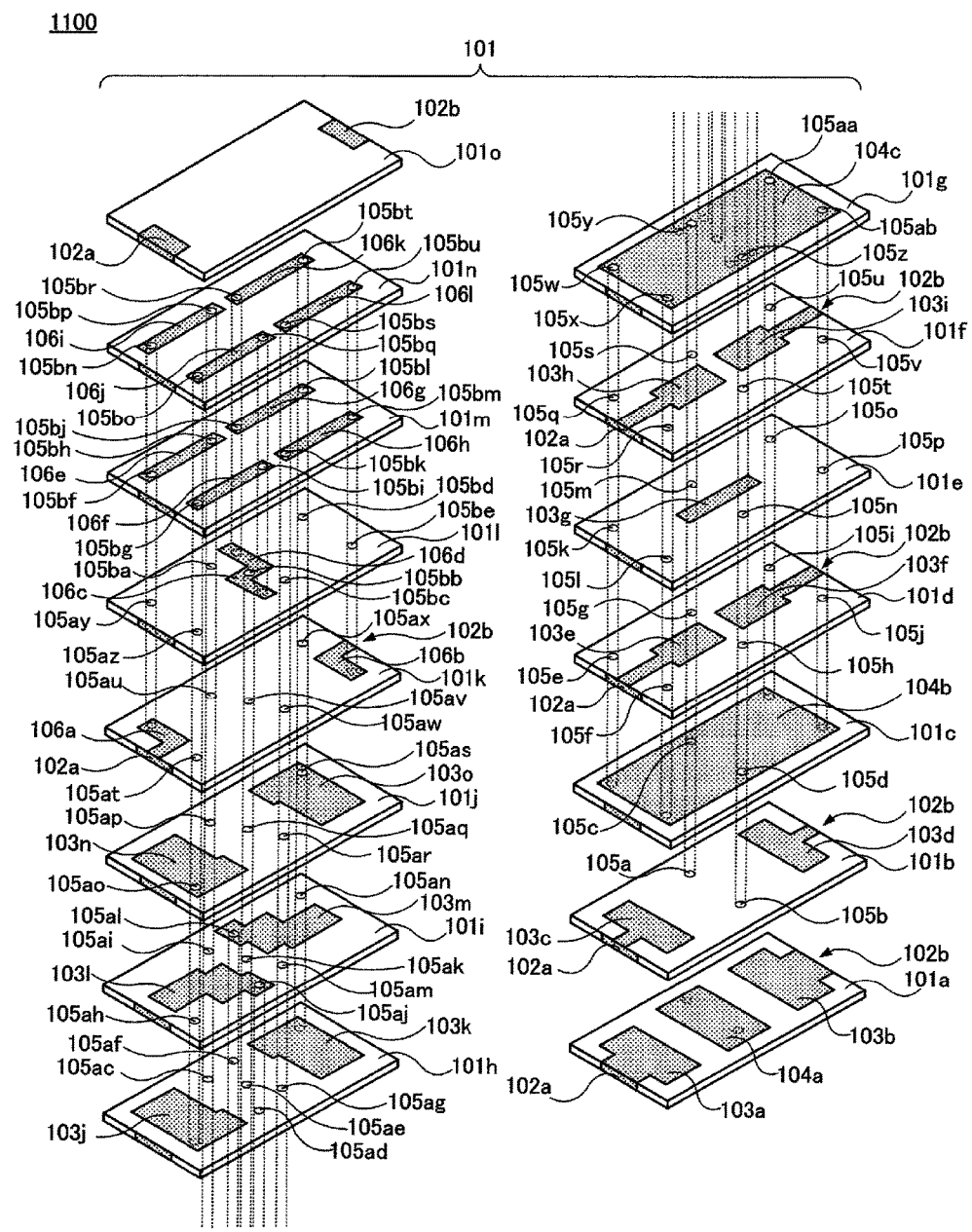
FIG. 7 is an exploded perspective view illustrating a laminated LC filter 1100 disclosed in International Publication No. WO 2012/077498.
Figure 8:
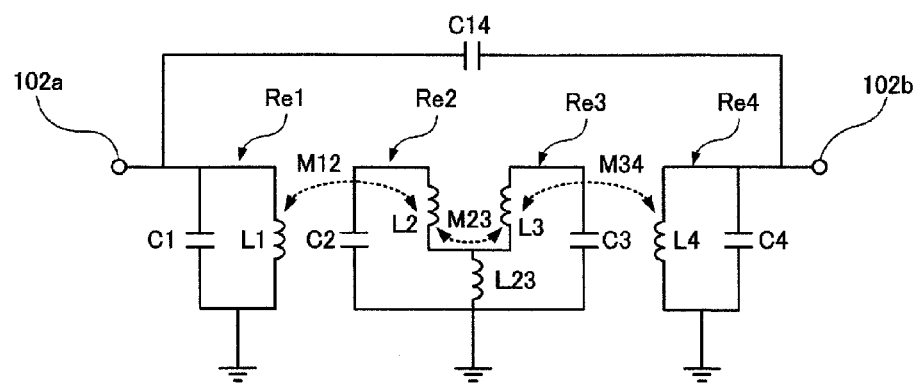
FIG. 8 is an equivalent circuit diagram of the laminated LC filter 1100.
Figure 9:
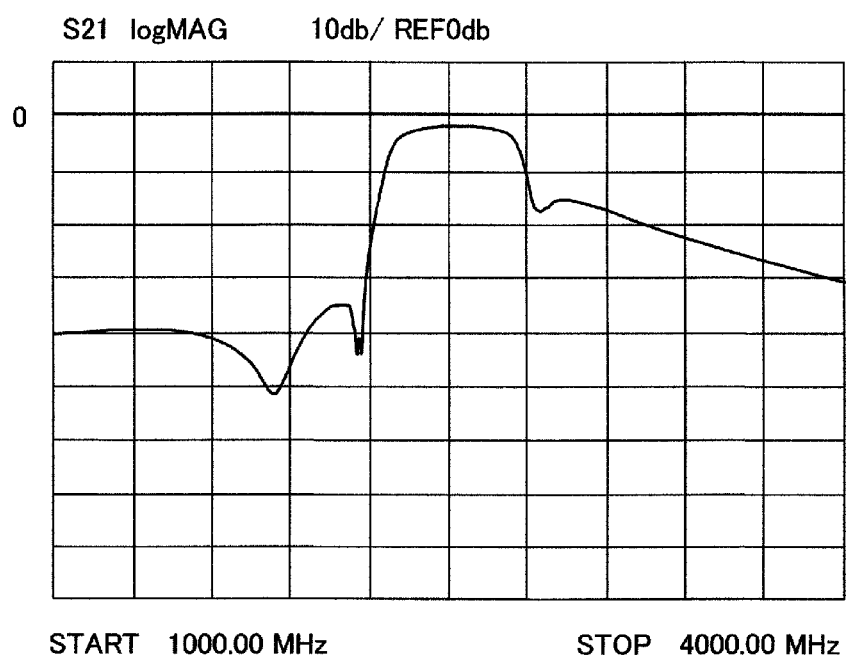
FIG. 9 is a graph illustrating frequency characteristics of the laminated LC filter 1100.

This configuration is also used in the laminated LC filter 1100 disclosed in International Publication No. WO 2012/077498, as shown in FIGS. 7 through 9. However, the magnetic coupling between the inductors L2 and L3 in the laminated LC filter 100 of the present preferred embodiment is significantly stronger than that in the laminated LC filter 1100 of International Publication No. WO 2012/077498.

In the laminated LC filter 1100 disclosed in International Publication No. WO 2012/077498, as shown in FIG. 7, the line electrode 106*f* defining the inductor L2 and the line electrode 106*g* defining the inductor L3 are not connected to one another, and the line electrode 106*j* defining the inductor L2 and the line electrode 106*k* defining inductor L3 are also not connected to one another, but the line electrode 106*c* defining the inductor L2 and the line electrode 106*d* defining the inductor L3 are connected at a position closer to the ground electrode 104*c*, and then connected to the ground electrode 104*c* through the common inductor L23 defined by the via electrodes 105*bb*, 105*av*, 105*aq*, 105*ak*, and 105*ae*. Accordingly, in the laminated LC filter 1100, the inductors L2 and L3 are not integrated to be common to the maximum extent possible, and the strength of the magnetic coupling between the inductors L2 and L3 is relatively weak as compared to the structure of the present preferred embodiment.

In contrast, in the laminated LC filter 100 according to the present preferred embodiment, the line electrode portion of the inductor L2 that is defined by the line electrodes 6*f*, 6*j*, and 6*n* connected in three layers through the via electrodes 7*an*, 7*ao*, 7*ap*, 7*aw*, 7*ax*, and 7*ay*, and the line electrode portion of the inductor L3 that is defined by the line electrodes 6*g*, 6*k*, and 6*o* connected in three layers through the via electrodes 7*ap*, 7*aq*, 7*ar*, 7*ay*, 7*az*, and 7*ba* are connected, and then connected to the ground electrode 5*b* through the common inductor L23 defined by the via electrodes 7*ah*, 7*aa*, and 7*u*.

That is, in the laminated LC filter 100, the inductor L2 and the inductor L3 are preferably connected at the line electrode portions thereof, and the ground-side via electrode portion of the inductor L2 and the ground-side via electrode portion of the inductor L3 are completely integrated by the common inductor L23. In other words, in the laminated LC filter 100, the inductor L2 and the inductor L3 are integrated to be common to the maximum extent possible so that the magnetic coupling between the inductor L2 and the inductor L3 is significantly stronger as compared to the laminated LC filter 1100 disclosed International Publication No. WO 2012/077498.

In the laminated LC filter 100, since the magnetic coupling between the inductors L2 and L3 is strengthened to the maximum extent possible, the pass band thereof is further widened.

Further, in the laminated LC filter 100, the third-stage LC parallel resonator Re3 and the fourth-stage LC parallel resonator Re4 are preferably primarily capacitively coupled through the capacitor C34.

Furthermore, in the laminated LC filter 100, the first-stage LC parallel resonator Re1 and the fourth-stage LC parallel resonator Re4 are primarily capacitively coupled through the capacitor C14.

Moreover, with the structure of the laminated LC filter 100 according to the present preferred embodiment of the present invention, the inductor L1 in the first-stage LC parallel resonator Re1 and the inductor L3 in the third-stage LC parallel resonator Re3 are coupled by magnetic coupling M13, and the inductor L2 in the second-stage LC parallel resonator Re2 and the inductor L4 in the fourth-stage LC parallel resonator Re4 are coupled by magnetic coupling M24.

That is, because the loop of the inductor L1 in the first-stage LC parallel resonator Re1 and the loop of the inductor L3 in the third-stage LC parallel resonator Re3 are disposed at an angle at which magnetic coupling is obtained, and the winding directions thereof are the same, the inductor L1 and the inductor L3 are coupled by the magnetic coupling M13.

Further, because the loop of the inductor L2 in the second-stage LC parallel resonator Re2 and the loop of the inductor L4 in the fourth-stage LC parallel resonator Re4 are disposed at an angle at which magnetic coupling is obtained, and the winding directions thereof are the same, the inductor L2 and the inductor L4 are coupled by the magnetic coupling M24.

In the laminated LC filter 100 according to the present preferred embodiment, the inductor L1 in the first-stage LC parallel resonator Re1 and the inductor L3 in the third-stage LC parallel resonator Re3 are coupled by the magnetic coupling M13, and the inductor L2 in the second-stage LC parallel resonator Re2 and the inductor L4 in the fourth-stage LC parallel resonator Re4 are coupled by the magnetic coupling M24, such that an attenuation pole having sufficient attenuation is provided near the pass band and high attenuation characteristics are achieved.

Figure 3:
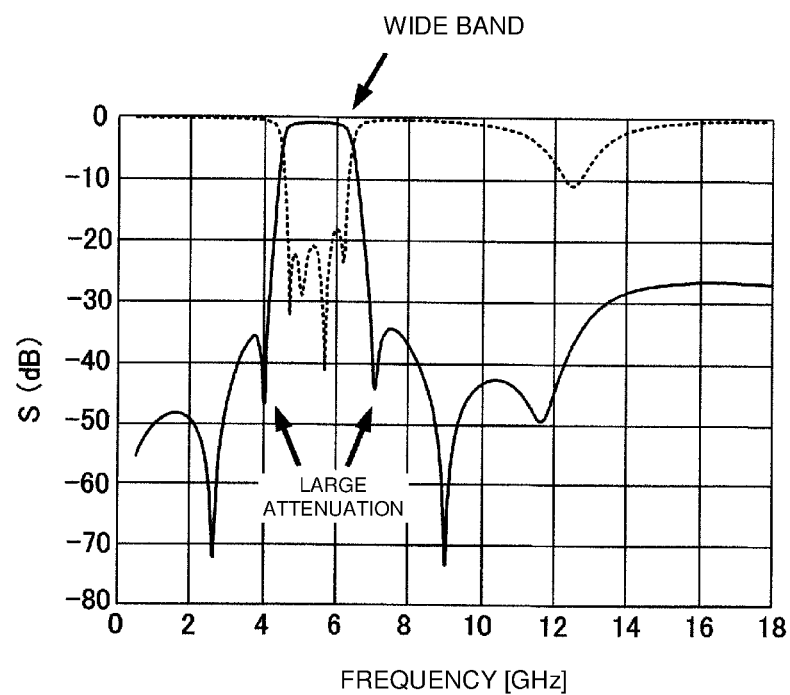
FIG. 3 is a graph illustrating frequency characteristics of the laminated LC filter 100.

FIG. 3 illustrates frequency characteristics of the laminated LC filter 100 according to the present preferred embodiment. Note that a solid line indicates a bandpass characteristic while a broken line indicates a reflection characteristic.

As is understood from FIG. 3, the laminated LC filter 100 has a wide pass band. As described above, causing the inductor L2 in the second-stage LC parallel resonator Re2 and the inductor L3 in the third-stage LC parallel resonator Re3 to be strongly coupled by the magnetic coupling M23 contributes to the widening of the pass band.

As is also understood from FIG. 3, in the laminated LC filter 100, an attenuation pole having sufficient attenuation is provided near the pass band so that high attenuation characteristics are achieved. As described above, causing the inductor L1 in the first-stage LC parallel resonator Re1 and the inductor L3 in the third-stage LC parallel resonator Re3 to be coupled by the magnetic coupling M13 and causing the inductor L2 in the second-stage LC parallel resonator Re2 and the inductor L4 in the fourth-stage LC parallel resonator Re4 to be coupled by the magnetic coupling M24 contribute to the attenuation pole being provided near the pass band.

The laminated LC filter 100 according to the present preferred embodiment has excellent frequency characteristics.

Second Preferred Embodiment

Figure 4:
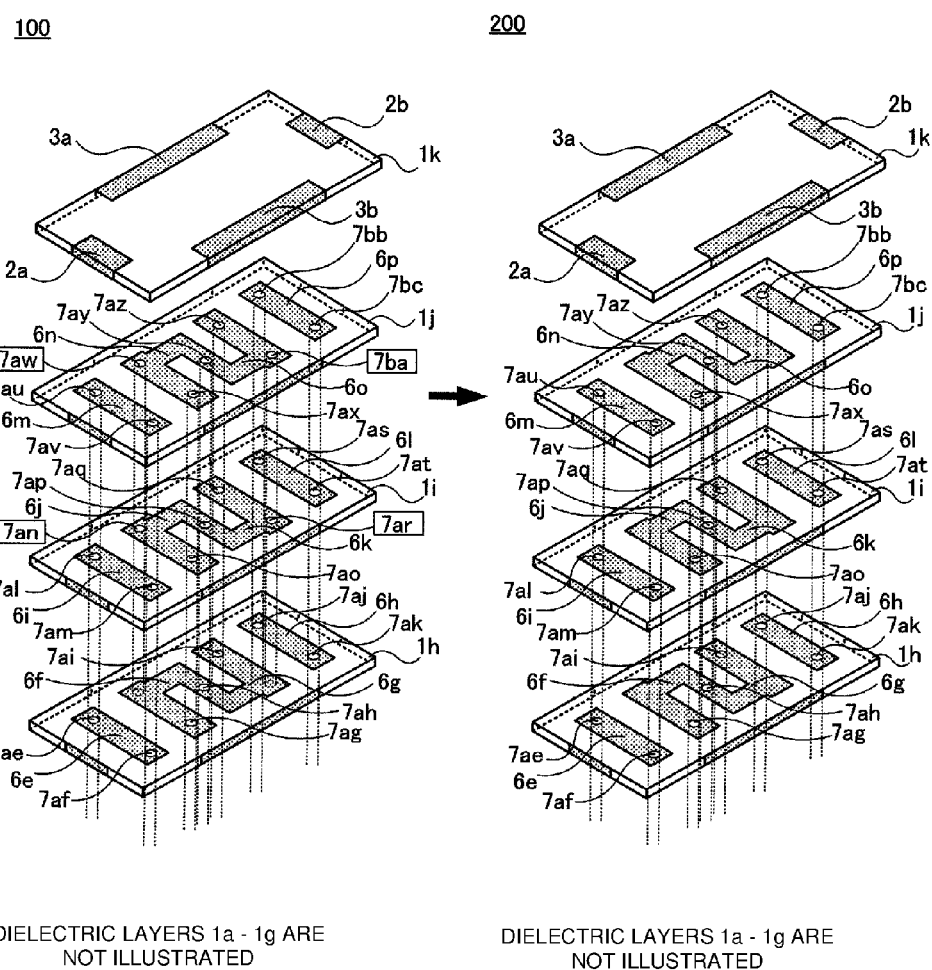
FIG. 4 is an exploded perspective view illustrating a main portion of a laminated LC filter 200 according to a second preferred embodiment of the present invention, and the laminated LC filter 100 according to the first preferred embodiment of the present invention is also illustrated in FIG. 4 for reference.

FIG. 4 illustrates a laminated LC filter 200 according to a second preferred embodiment of the present invention.

FIG. 4 is an exploded perspective view illustrating a main portion of the laminated LC filter 200. It is to be noted that the laminated LC filter 100 according to the first preferred embodiment is also illustrated in FIG. 4 for comparison.

In the laminated LC filter 200, the via electrodes 7*an*, 7*ar*, 7*aw*, and 7*ba* are preferably removed from the laminated LC filter 100 according to the first preferred embodiment.

That is, in the laminated LC filter 100, when the line electrode portion of the inductor L2 in the second-stage LC parallel resonator Re2 includes three layers of the line electrodes 6*f*, 6*j*, and 6*n*, each one end of the line electrodes is connected through the via electrodes 7*ao* and 7*ax*, each intermediate portion thereof is connected through the via electrodes 7*an* and 7*aw*, and each other end thereof is connected through the via electrodes 7*ap* and 7*ay*. However, in the laminated LC filter 200, the connections of the intermediate portions through the via electrodes 7*an* and 7*aw* are preferably removed.

Similarly, in the laminated LC filter 100, when the line electrode portion of the inductor L3 in the third-stage LC parallel resonator Re3 includes three layers of the line electrodes 6*g*, 6*k*, and 6*o*, each one end of the line electrodes is connected through the via electrodes 7*aq* and 7*az*, each intermediate portion thereof is connected through the via electrodes 7*ar* and 7*ba*, and each other end thereof is connected through the via electrodes 7*ap* and 7*ay*. However, in the laminated LC filter 200, the connections of the intermediate portions through the via electrodes 7*ar* and 7*ba* are removed.

In the laminated LC filter 200, although the via electrodes 7*an*, 7*ar*, 7*aw*, and 7*ba* are removed, any change in frequency characteristics is not observed as compared to the laminated LC filter 100. As such, as in the laminated LC filter 100, an attenuation pole having sufficient attenuation is provided near the pass band while maintaining a wide band, thereby achieving the high attenuation characteristics.

Third Preferred Embodiment

Figure 5:
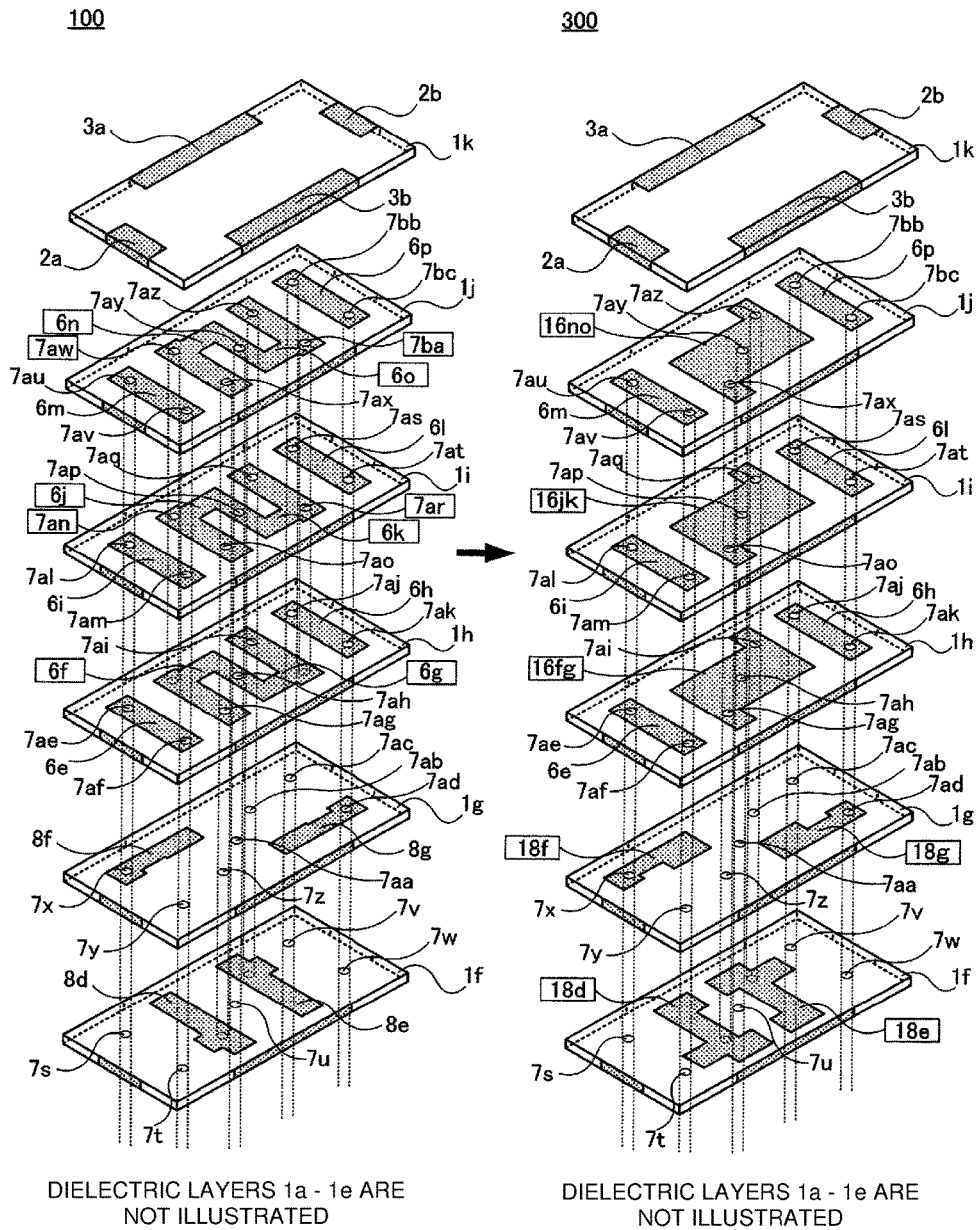
FIG. 5 is an exploded perspective view illustrating a main portion of a laminated LC filter 300 according to a third preferred embodiment of the present invention, and the laminated LC filter 100 according to the first preferred embodiment of the present invention is also illustrated in FIG. 5 for reference.

FIG. 5 illustrates a laminated LC filter 300 according to a third preferred embodiment of the present invention.

FIG. 5 is an exploded perspective view illustrating a main portion of the laminated LC filter 300. It is to be noted that the laminated LC filter 100 according to the first preferred embodiment is also illustrated in FIG. 5 for comparison.

In the laminated LC filter 300, as in the laminated LC filter 200 according to the second preferred embodiment, the via electrodes 7*an*, 7*ar*, 7*aw*, and 7*ba* are preferably removed from the laminated LC filter 100 according to the first preferred embodiment.

Further, in the laminated LC filter 300, the shapes of the line electrodes 6*f*, 6*j*, and 6*n* defining the line electrode portion of the inductor L2 in the second-stage LC parallel resonator Re2 and the shapes of the line electrodes 6*g*, 6*k*, and 6*o* defining the line electrode portion of the inductor L3 in the third-stage LC parallel resonator Re3 are preferably modified.

More specifically, preferably, the line electrode 6*f* and the line electrode 6*g* are integrated so as to be a single entity, such as a line electrode 16*fg* that has a rectangular or substantially rectangular shape and a large surface area, for example.

Similarly, preferably, the line electrode 6*j* and the line electrode 6*k* are integrated so as to be a single entity, such as a line electrode 16*jk* that has a rectangular or substantially rectangular shape and a large surface area, for example.

Similarly, preferably, the line electrode 6*n* and the line electrode 6*o* are integrated so as to be a single entity, such as a line electrode 16*no* that has a rectangular or substantially rectangular shape and a large surface area, for example.

In the laminated LC filter 300, with the removal of the above-described via electrodes and the modification of the shapes of the above-described line electrodes, the shapes of the capacitor electrodes 8*a*, 8*d*, 8*e*, 8*f*, and 8*g* are also modified in order to adjust the frequency characteristics.

As shown in FIG. 5, the shape of the capacitor electrode 8*d* is preferably modified so as to have the shape of a capacitor electrode 18*d*, the shape of the capacitor electrode 8*e* is modified so as to have the shape of a capacitor electrode 18*e*, the shape of the capacitor electrode 8*f* is modified so as to have the shape of a capacitor electrode 18*f*, and the shape of the capacitor electrode 8*g* is modified so as to have the shape of a capacitor electrode 18*g*. Note that in FIG. 5, because the dielectric layer 1*c* on which the capacitor electrode 8*a* is provided is not illustrated, the capacitor electrode 8*a* with its shape having been modified is also not illustrated.

In the laminated LC filter 300, preferably, some of the via electrodes are removed and the shapes of some of the line electrodes and capacitor electrodes are modified as compared to the laminated LC filter 100 according to the first preferred embodiment. However, the laminated LC filter 300 exhibits excellent frequency characteristics similarly to the laminated LC filter 100.

Fourth Preferred Embodiment

Figure 6:
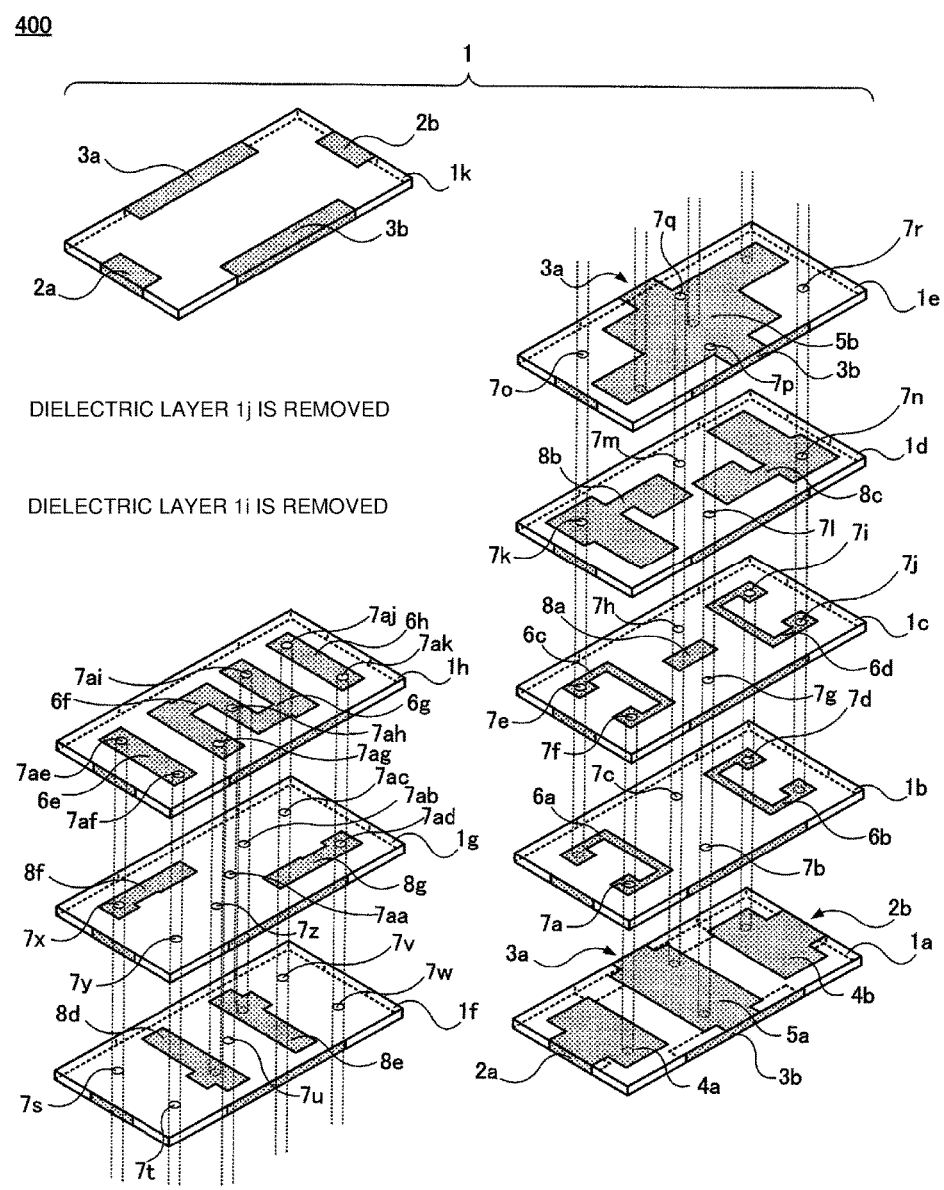
FIG. 6 is an exploded perspective view illustrating a laminated LC filter 400 according to a fourth preferred embodiment of the present invention.

A laminated LC filter 400 according to a fourth preferred embodiment of the present invention is shown in FIG. 6.

FIG. 6 is an exploded perspective view of the laminated LC filter 400.

In the laminated LC filter 400, the dielectric layers 1*i* and 1*j* are removed, together with the via electrodes and the line electrodes provided on the two dielectric layers 1*i* and 1*j*, from the laminated LC filter 100 according to the first preferred embodiment, and then the dielectric layer 1*k* is laminated on the dielectric layer 1*h*.

That is, although the line electrode portion of the inductor L1 in the first-stage LC parallel resonator Re1 is defined by the line electrodes 6*e*, 6*i*, and 6*m* including three layers in the laminated LC filter 100 according to the first preferred embodiment, the line electrode portion of the inductor L1 in the laminated LC filter 400 is preferably defined by the line electrode 6*e* including a single layer.

Similarly, although the line electrode portion of the inductor L2 in the second-stage LC parallel resonator Re2 is defined by the line electrodes 6*f*, 6*j*, and 6*n* including three layers in the laminated LC filter 100, the line electrode portion of the inductor L2 in the laminated LC filter 400 is preferably defined by the line electrode 6*f* including a single layer.

Similarly, although the line electrode portion of the inductor L3 in the third-stage LC parallel resonator Re3 is defined by the line electrodes 6*g*, 6*k*, and 6*o* including three layers in the laminated LC filter 100, the line electrode portion of the inductor L3 in the laminated LC filter 400 is preferably defined by the line electrode 6g including a single layer.

Similarly, although the line electrode portion of the inductor L4 in the fourth-stage LC parallel resonator Re4 is defined by the line electrodes 6h, 6i, and 6p including three layers in the laminated LC filter 100, the line electrode portion of the inductor L4 in the laminated LC filter 400 is preferably defined by the line electrode 6h including a single layer.

Although the multi-layer structure of the line electrode portions of the inductors contributes to lowering resistance and improving a Q value, such a multi-layer structure is not necessary in preferred embodiments of the present invention. Alternatively, as in the laminated LC filter 400, each line electrode portion can be defined by a line electrode including a single layer.

The laminated LC filters 100 through 400 according to the first through fourth preferred embodiments of the present invention, respectively, have been discussed. However, the present invention is not limited thereto, and various modifications can be made within the scope and spirit of the present invention.

For example, although each of the laminated LC filters 100 through 400 preferably is a four-stage laminated LC filter including the four LC parallel resonators Re1 through Re4, the number of stages is not limited to four.

For example, the filter may be a five-stage laminated LC filter including five LC parallel resonators Re1 through Re5, a six-stage laminated LC filter including six LC parallel resonators Re1 through Re6, or a multi-stage laminated LC filter including six or more LC parallel resonators.

Further, at least a pair of inductor loops in odd numbered-stage LC parallel resonators, which are disposed at an angle at which magnetic coupling is obtained therebetween and the winding directions of which are the same, refers to the loops of the inductors in the first-stage and third-stage LC parallel resonators in any of the laminated LC filters 100 through 400. However, the combination of inductor loops is not limited thereto.

For example, the loops of inductors in the first-stage, third-stage, and fifth-stage LC parallel resonators may be combined. Alternatively, the loops of inductors in the third-stage and fifth-stage LC parallel resonators may be combined.

Further, the number of layers, shapes, materials, and other structural features of the dielectric layers as well as the number, shapes, materials, and other structural features of the line electrodes, capacitor electrodes, ground electrodes, via electrodes, and other elements are not limited to the aforementioned examples, and can be arbitrarily determined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated LC filter comprising:
a multilayer body including a plurality of dielectric layers that are laminated;
a plurality of line electrodes disposed between respective layers of the plurality of dielectric layers;
a plurality of capacitor electrodes disposed between respective layers of the plurality of dielectric layers;
at least one ground electrode disposed between respective layers of the plurality of dielectric layers; and
a plurality of via electrodes extending through two main surfaces of respective layers of the plurality of dielectric layers; wherein
the laminated LC filter includes at least four LC parallel resonators inside the multilayer body and has a predetermined pass band;
an inductor and a capacitor are connected in parallel in each of the at least four LC parallel resonators;
the inductor of each of the at least four LC parallel resonators includes: a capacitor-side via electrode portion which is defined by at least one of the plurality of via electrodes and one end of which is connected to one of the plurality of capacitor electrodes, a line electrode portion which is defined by at least one of the plurality of line electrodes and one end of which is connected to another end of the capacitor-side via electrode portion, and a ground-side via electrode portion which is defined by at least one of the plurality of via electrodes, one end of the ground-side via electrode portion is connected to another end of the line electrode portion, and another end of the ground-side via electrode portion is connected to the at least one ground electrode;
the inductor of each of the at least four LC parallel resonators includes a loop with a predetermined winding direction and connecting the capacitor-side via electrode portion, the line electrode portion, and the ground-side via electrode portion to each other;
the capacitor of each of the at least four LC parallel resonators is defined by a capacitance produced between the capacitor electrode and the ground electrode or a capacitance produced among the plurality of capacitor electrodes;
the loops of the inductors of a pair of the LC parallel resonators among the at least four LC parallel resonators are disposed at an angle at which magnetic coupling is obtained between each other, and winding directions of the loops of the inductors are the same;
the at least four LC parallel resonators include at least a first-stage LC parallel resonator, a second-stage LC parallel resonator, a third-stage LC parallel resonator, and a fourth-stage LC parallel resonator;
the first-stage LC parallel resonator, the second-stage LC parallel resonator, the third-stage LC parallel resonator, and the fourth-stage LC parallel resonator are respectively arranged in that order;
the winding direction of the loop of the inductor in the second-stage LC parallel resonator and the winding direction of the loop of the inductor in the third-stage LC parallel resonator are different from each other;
the ground-side via electrode portion of the inductor in the second-stage LC parallel resonator and the ground-side via electrode portion of the inductor in the third-stage LC parallel resonator are integrated to define a common ground-side via portion; and
one end of the common ground-side via portion is connected to the another end of the line electrode portion of each of the inductor in the second-stage LC parallel resonator and the inductor in the third-stage LC parallel resonator and another end of the common ground-side via portion is connected to the at least one ground electrode.

2. The laminated LC filter according to claim 1, wherein each of the plurality of dielectric layers is made of a ceramic material.

3. The laminated LC filter according to claim 1, wherein the line electrode portion of the inductor in the second-stage LC parallel resonator and the line electrode portion of the inductor in the third-stage LC parallel resonator are each multi-layered and include a plurality of layers of the line electrode portion; and the line electrode portion of the inductor in the second-stage LC parallel resonator and the line electrode portion of the inductor in the third-stage LC parallel resonator are directly connected.

4. The laminated LC filter according to claim 3, wherein each of the line electrode portion of the inductor in the second-stage LC parallel resonator and the line electrode portion of the inductor in the third-stage LC parallel resonator includes two layers of the line electrode portion; and one end of each of the two layers of the line electrode portion are connected through a first one of the plurality of via electrodes, and another end of each of the two layers of the line electrode portion are connected through a second one of the plurality of via electrodes.

5. The laminated LC filter according to claim 3, wherein each of the line electrode portion of the inductor in the second-stage LC parallel resonator and the line electrode portion of the inductor in the third-stage LC parallel resonator includes three layers of the line electrode portion; and one end of each of the three layers of the line electrode portion are connected to each other through first and second via electrodes of the plurality of via electrodes, and another end of each of the three layers of the line electrode portion are connected to each other through third and fourth via electrodes of the plurality of via electrodes.

6. The laminated LC filter according to claim 1, wherein a pair of input-output terminals are provided on opposing end surfaces of at least one layer of the plurality of dielectric layers, and a pair of ground terminals are provided on opposing side surfaces of the at least one layer of the plurality of dielectric layers.

7. The laminated LC filter according to claim 6, wherein a pair of connection electrodes and a second ground electrode are provided on an upper-side main surface of the at least one layer of the plurality of dielectric layers;

the pair of connection electrodes are respectively connected to the pair of input-output terminals; and the second ground electrode is connected to both of the pair of ground terminals.

8. The laminated LC filter according to claim 6, wherein the pair of input-output terminals are also provided on opposing end surfaces of all of the plurality of dielectric layers, and the pair of ground terminals are provided on opposing side surfaces of all of the plurality of dielectric layers.

9. The laminated LC filter according to claim 6, wherein the pair of input-output terminals and the pair of ground terminals include Ag, Cu, or an alloy of Ag and Cu as a main component.

10. The laminated LC filter according to claim 9, wherein each of the pair of input-output terminals and the pair of ground terminals include a plating layer that includes Ni, Sn, or Au as a main component.

11. The laminated LC filter according to claim 1, wherein the line electrode portion of the inductor in the second-stage LC parallel resonator and the line electrode portion of the inductor in the third-stage LC parallel resonator are single-layered line electrode portions; and the line electrode portion of the inductor in the second-stage LC parallel resonator and the line electrode portion of the inductor in the third-stage LC parallel resonator are directly connected.

12. The laminated LC filter according to claim 1, wherein the first-stage LC parallel resonator and the second-stage LC parallel resonator are primarily coupled to one another through capacitive coupling.

13. The laminated LC filter according to claim 1, wherein the second-stage LC parallel resonator and the third-stage LC parallel resonator are primarily coupled to one another through magnetic coupling.

14. The laminated LC filter according to claim 1, wherein the third-stage LC parallel resonator and the fourth-stage LC parallel resonator are primarily coupled to one another through capacitive coupling.

15. The laminated LC filter according to claim 1, wherein the first-stage LC parallel resonator and the fourth-stage LC parallel resonator are primarily coupled to one another through capacitive coupling.

\* \* \* \* \*